US007957439B2

(12) United States Patent
Stephens et al.

(10) Patent No.: US 7,957,439 B2
(45) Date of Patent: Jun. 7, 2011

(54) MICROCHANNEL COOLER FOR HIGH EFFICIENCY LASER DIODE HEAT EXTRACTION

(75) Inventors: Edward F. Stephens, Golden Eagle, IL (US); Steven M. Coleman, Bedford, NH (US)

(73) Assignee: Northrop Grumman Space & Missions, Los Angeles, CA (US)

( * ) Notice: Subject to any disclaimer, the term of this patent is extended or adjusted under 35 U.S.C. 154(b) by 0 days.

(21) Appl. No.: 12/628,842

(22) Filed: Dec. 1, 2009

(65) Prior Publication Data

US 2010/0074285 A1 Mar. 25, 2010

Related U.S. Application Data

(63) Continuation of application No. 11/493,228, filed on Jul. 26, 2006, now Pat. No. 7,656,915.

(51) Int. Cl.
*H01S 3/04* (2006.01)

(52) U.S. Cl. ............... 372/35; 372/34; 372/36

(58) Field of Classification Search .......... None
See application file for complete search history.

(56) References Cited

U.S. PATENT DOCUMENTS

| 3,303,432 A | 2/1967 | Garfinkel et al. |
| 3,339,151 A | 8/1967 | Smith |
| 3,590,248 A | 6/1971 | Chatterton, Jr. |
| 3,654,497 A | 4/1972 | Dyment et al. |
| 3,683,296 A | 8/1972 | Scalise |
| 3,771,031 A | 11/1973 | Kay |
| 3,802,967 A | 4/1974 | Ladany et al. |
| 3,896,473 A | 7/1975 | DiLorenzo et al. |
| 3,958,263 A | 5/1976 | Panish et al. |
| 3,962,655 A | 6/1976 | Selway et al. |
| 4,057,101 A | 11/1977 | Ruka et al. |
| 4,092,614 A | 5/1978 | Sakuma et al. |
| 4,219,072 A | 8/1980 | Barlow |
| 4,228,406 A | 10/1980 | Lewis et al. |
| 4,233,567 A | 11/1980 | Chernoch |
| 4,315,225 A | 2/1982 | Allen, Jr. et al. |
| 4,383,270 A | 5/1983 | Schelhorn |
| 4,393,393 A | 7/1983 | Allen, Jr. et al. |

(Continued)

FOREIGN PATENT DOCUMENTS

EP 0 458 469 A1 4/1991

(Continued)

OTHER PUBLICATIONS

B. Welber, *Heat Sink for High Powered Injection Lasers*, IBM Technical Disclosure Bulletin, (Sep. 1965) (2 pages).

(Continued)

*Primary Examiner* — Minsun Harvey
*Assistant Examiner* — Sean Hagan
(74) *Attorney, Agent, or Firm* — Nixon Peabody LLP (57) ABSTRACT

A laser diode package includes a laser diode, a cooler, and a metallization layer. The laser diode is used for converting electrical energy to optical energy. The cooler receives and routes a coolant from a cooling source via internal channels. The cooler includes a plurality of ceramic sheets and a highly thermally-conductive sheet. The ceramic sheets are fused together and the thermally-conductive sheet is attached to a top ceramic sheet of the plurality of ceramic sheets. The metallization layer has at least a portion on the thermally-conductive sheet. The portion is electrically coupled to the laser diode for conducting the electrical energy to the laser diode.

20 Claims, 4 Drawing Sheets

U.S. PATENT DOCUMENTS

| | | | |
|---|---|---|---|
| 4,415,234 A | 11/1983 | Myers | |
| 4,454,602 A | 6/1984 | Smith | |
| 4,573,067 A | 2/1986 | Tuckermann et al. | |
| 4,617,585 A | 10/1986 | Yasui | |
| 4,673,030 A | 6/1987 | Basiulis | |
| 4,709,750 A | 12/1987 | White | |
| 4,716,568 A | 12/1987 | Scifres et al. | |
| 4,730,324 A | 3/1988 | Azad | |
| 4,782,222 A | 11/1988 | Ragle et al. | |
| 4,831,629 A | 5/1989 | Paoli et al. | |
| 4,837,768 A | 6/1989 | Schmid | |
| 4,847,848 A | 7/1989 | Inoue et al. | |
| 4,852,109 A | 7/1989 | Kuchar | |
| 4,877,641 A | 10/1989 | Dory | |
| 4,881,233 A | 11/1989 | von Arb et al. | |
| 4,881,237 A | 11/1989 | Donnelly | |
| 4,899,204 A | 2/1990 | Rosen et al. | |
| 4,901,330 A | 2/1990 | Wolfram et al. | |
| 4,949,346 A | 8/1990 | Kuper et al. | |
| 4,963,741 A | 10/1990 | McMullin | |
| 4,975,923 A | 12/1990 | Buus et al. | |
| 5,001,355 A | 3/1991 | Rosen et al. | |
| 5,005,640 A | 4/1991 | Lapinski et al. | |
| 5,022,042 A | 6/1991 | Bradley | |
| 5,031,187 A | 7/1991 | Orenstein et al. | |
| 5,040,187 A | 8/1991 | Karpinski | |
| 5,073,838 A | 12/1991 | Ames | |
| 5,076,348 A | 12/1991 | Bluege | |
| 5,084,888 A | 1/1992 | Tajima et al. | |
| 5,099,214 A | 3/1992 | Rosen et al. | |
| 5,099,487 A * | 3/1992 | Rickey et al. | 372/35 |
| 5,099,488 A | 3/1992 | Ahrabi et al. | |
| 5,105,429 A | 4/1992 | Mundinger et al. | |
| 5,115,445 A | 5/1992 | Mooradian | |
| 5,128,951 A | 7/1992 | Karpinski | |
| 5,156,999 A | 10/1992 | Lee | |
| 5,163,064 A | 11/1992 | Kim et al. | |
| 5,212,699 A | 5/1993 | Masuko et al. | |
| 5,216,263 A | 6/1993 | Paoli | |
| 5,216,688 A | 6/1993 | Kortz et al. | |
| 5,220,954 A | 6/1993 | Longardner et al. | |
| 5,253,260 A | 10/1993 | Palombo | |
| 5,265,113 A | 11/1993 | Halldörsson et al. | |
| 5,284,790 A | 2/1994 | Karpinski | |
| 5,287,375 A | 2/1994 | Fujimoto | |
| 5,305,344 A | 4/1994 | Patel | |
| 5,311,535 A | 5/1994 | Karpinski | |
| 5,311,536 A | 5/1994 | Paoli et al. | |
| 5,315,154 A | 5/1994 | Elwell | |
| 5,323,411 A | 6/1994 | Shirasaka et al. | |
| 5,325,384 A | 6/1994 | Herb et al. | |
| 5,337,325 A | 8/1994 | Hwang | |
| 5,351,259 A | 9/1994 | Ishimori et al. | |
| 5,388,755 A | 2/1995 | Baxter | |
| 5,394,426 A | 2/1995 | Joslin | |
| 5,394,427 A | 2/1995 | McMinn et al. | |
| 5,402,436 A | 3/1995 | Paoli | |
| 5,402,437 A | 3/1995 | Mooradian | |
| 5,438,580 A | 8/1995 | Patel et al. | |
| 5,485,482 A | 1/1996 | Selker et al. | |
| 5,520,244 A | 5/1996 | Mundinger et al. | |
| 5,526,373 A | 6/1996 | Karpinski | |
| 5,663,979 A | 9/1997 | Marshall | |
| 5,734,672 A | 3/1998 | McMinn et al. | |
| 5,745,514 A | 4/1998 | Patel et al. | |
| 5,764,675 A | 6/1998 | Juhala | |
| 5,834,840 A | 11/1998 | Robbins et al. | |
| 5,835,515 A | 11/1998 | Huang | |
| 5,835,518 A | 11/1998 | Mundinger et al. | |
| 5,898,211 A | 4/1999 | Marshall et al. | |
| 5,903,583 A | 5/1999 | Ullman et al. | |
| 5,985,684 A | 11/1999 | Marshall et al. | |
| 5,987,043 A | 11/1999 | Brown et al. | |
| 6,245,307 B1 | 6/2001 | Inui et al. | |
| 6,307,871 B1 | 10/2001 | Herberle | |
| 6,310,900 B1 | 10/2001 | Stephens et al. | |
| 6,351,478 B1 | 2/2002 | Heberle | |
| 6,352,873 B1 | 3/2002 | Hoden | |
| 6,397,618 B1 | 6/2002 | Chu et al. | |
| 6,480,514 B1 | 11/2002 | Lorenzen et al. | |
| 6,570,895 B2 | 5/2003 | Heberle | |
| 6,636,538 B1 | 10/2003 | Stephens | |
| 6,919,525 B2 | 7/2005 | Pinneo | |
| 2002/0018498 A1 | 2/2002 | Heberle | 372/35 |
| 2005/0051891 A1 | 3/2005 | Yoshida et al. | 257/720 |
| 2006/0045154 A1 | 3/2006 | Linares | 372/36 |

FOREIGN PATENT DOCUMENTS

| | | | |
|---|---|---|---|
| EP | 0 458 469 A1 | 11/1991 | 257/675 |
| EP | 0 550 996 A1 | 1/1992 | |
| EP | 0550 996 B1 | 12/1992 | |
| EP | 0 634 822 BI | 7/1994 | |
| EP | 0 805 527 B1 | 4/1997 | |
| EP | 0 833 419 A1 | 9/1997 | |
| JP | 55-65450 | 5/1980 | |
| JP | 60211992 | 10/1985 | |
| JP | 01123493 A | 5/1989 | |
| JP | 02281782 | 11/1990 | |
| JP | 3-6875 | 1/1991 | |
| JP | 03016290 A | 1/1991 | |
| JP | 3-269325 | 3/1991 | |
| JP | 4-359207 | 6/1991 | |
| JP | 04023381 | 1/1992 | |
| JP | 04-314375 | 11/1992 | |
| JP | 6-13717 | 1/1993 | |
| JP | 2002-353551 A | 12/2002 | |
| JP | 2004-146720 A | 5/2004 | |
| JP | 2004-356429 A | 12/2004 | |
| JP | 2006-032406 A | 2/2006 | |
| WO | WO 96/28846 | 9/1996 | |
| WO | WO 2006/006455 A1 | 1/2006 | |

OTHER PUBLICATIONS

Ahearn, W.E., "Thermal Spacer For Room Temperature Close-Packed GaAs Laser Arrays," IBM Technical Disclosure Bulleting, vol. 12, No. 12, p. 2311, May 1970.

Thomson CSF Semiconducteurs Specifiques, Package Specification (schematic), p. 3 (one page). Date unknown.

IBM Corp. "Heat Sink Assembly for Tab-Mounted Devices," IBM Technical Disclosure Bulletin, vol. 31, No. 6, pp. 372-373, Nov. 1988 (2 pages).

IBM Corp. "Circuit Module Cooling With Multiple Pistons Contacting A Heat Spreader/Electrical Buffer Plate In Contact With Chip," IBM Technical Disclosure Bulletin, vol. 31, No. 12, pp. 5-7, May 1989 (2 pages).

Mundinger, D. High Average Power Edge Emitting Laser Diode Arrays on Silicon Microchannel Coolers, Nov. 19, 1990 (3 pages).

Endriz, John G. "High Power Diode Laser Arrays," IEEE Journal of Quantum Electronics, No. 4, pp. 952-965, Apr. 1992 (14 pages).

Coherent Laser Group, Laser Diodes and Bars (article) (5 pages). Date unknown.

Sergey K. Gordeev et al., *SiC-Skeleton Cemented Diamond A Novel Engineering Material With Unique Properties*, Ceramic Engineering and Science Proceedings, vol. 21, No. 3, 753-760 (2000) (8 pages).

Article, "Micro Thermal Management of High-Power Diode Laser Bars," Dirk Lorenzen et al., IEEE Transactions on Industrial Electronics, vol. 48, No. 2, Apr. 2001, pp. 286-297 (12 pages).

Article, "Analysis of Substrates for Single Emitter Laser Diodes," Tapani M. Alander et al., Institute of Electronics, Sep. 2003, vol. 125, pp. 313-318 (6 pages).

Advancing Microelectronics Catalog, vol. 32, No. 3, May/Jun. 2005 (40 pages).

Michael Leers et al., *Expansion-Matched Passively Cooled Heatsinks With Low Thermal Resistance For High Power Diode Laser Bars*, Proceedings of the SPIE, vol. 6104, 20-29 (Feb. 2006) (10 pages).

Peter Z. Shi, K.M. Chua, Stephen C.K. Wong, & Y.M. Tan, *Design and Performance Optimization of Miniature Heat Pipes in LTCC*, Journal of Physics: Conference Series Institute of Physics Publishing, Bristol, GB, vol. 34, No. 1, 142-147 (Apr. 1, 2006) (6 pages).
PCT International Search Report for International Application No. PCT/US2007/016740 mailed on Feb. 1, 2008 (5 pages).

PCT International Search Report for International Application No. PCT/US2007/016517 mailed on Dec. 4, 2008 (4 pages).
PCT International Written Opinion for International Application No. PCT/US2007/016517 mailed on Dec. 4, 2008 (7 pages).

\* cited by examiner

MICROCHANNEL COOLER FOR HIGH EFFICIENCY LASER DIODE HEAT EXTRACTION

CROSS REFERENCE TO RELATED APPLICATIONS

This application is a continuation of U.S. application Ser. No. 11/493,228, titled "Microchannel Cooler For High Efficiency Laser Diode Heat Extraction" and filed Jul. 26, 2006, which is incorporated herein in its entirety.

FIELD OF THE INVENTION

The present invention relates generally to laser diodes and, in particular, to a cooling mechanism for a laser diode that provides improved heat dissipation without requiring a deionized water coolant.

BACKGROUND OF THE INVENTION

Semiconductor laser diodes have numerous advantages. One advantage is the small size of the laser diodes. For example, an active region of a laser diode has a width that is typically a submicron to a few microns, a height that is usually no more than a fraction of a millimeter, and a length that is typically less than about a millimeter. Internal reflective surfaces, which produce emission in one direction, are formed by cleaving the substrate from which the laser diodes are produced and, thus, have high mechanical stability.

High efficiencies are possible with semiconductor laser diodes with some having external quantum efficiencies near 70%. Semiconductor laser diodes produce radiation at wavelengths from about 20 to about 0.7 microns depending on the semiconductor alloy that is used. For example, laser diodes manufactured from gallium arsenide with aluminum doping ("AlGaAs") emit radiation at approximately 0.8 microns (~800 nm), which is near the absorption spectrum of common solid state laser rods and slabs manufactured from Neodymium-doped, Yttrium-Aluminum Garnet ("Nd:YAG"), and other crystals and glasses. Thus, semiconductor laser diodes can be used as an optical pumping source for larger, solid state laser systems.

Universal utilization of semiconductor laser diodes has been restricted by thermally related problems. These problems are associated with the large heat dissipation per unit area of the laser diodes that results in elevated junction temperatures and stresses induced by thermal cycling. Laser diode efficiency and the service life of the laser diode are decreased as the operating temperature in the junction increases.

Furthermore, the emitted wavelength of a laser diode is a function of its junction temperature. Thus, when a specific output wavelength is desired, maintaining a constant junction temperature is essential. For example, AlGaAs laser diodes that are used to pump an Nd:YAG rod or slab should emit radiation at about 808 nm because this is the wavelength at which optimum energy absorption exists in the Nd:YAG. However, for every 3.5° C. to 4.0° C. deviation in the junction temperature of the AlGaAs laser diode, the wavelength shifts 1 nm. Accordingly, controlling the junction temperature and, thus, properly dissipating the heat is critical.

When solid state laser rods or slabs are pumped by laser diodes, dissipation of the heat becomes more problematic because it becomes necessary to densely pack a plurality of individual diodes into arrays that generate the required amounts of input power for the larger, solid state laser rod or slab. However, when the packing density of the individual laser diodes is increased, the space available for extraction of heat from the individual laser diodes decreases. This aggravates the problem of heat extraction from the arrays of individual diodes.

One type of a cooling system for a laser diode package utilizes microchannel coolers made from metals, such as copper. These laser diode packages are small, e.g., 1 mm thick, and have small water channels running though them. The water channels pass close to a bottom side of the heat source (i.e., the laser diode bar), allowing for efficient thermal transfer. Because typical microchannel coolers are made from copper, electrical current and water coolant reside in the same physical space. Consequently, the coolant water must be deionized. However, the use of deionized water requires all the parts that are exposed to the water-supply to be either glass, plastic, stainless steel, or gold-plated. Parts that are not made of these materials usually deteriorate quickly due to erosion and corrosion problems. Accordingly, one problem associated with current microchannel coolers is that they require a complicated and expensive deionized water system.

Thus, a need exists for a microchannel cooling system for a laser diode that is electrically non-conductive and, preferably, has enhanced characteristics that reduce the adverse effects of the erosion and/or corrosion problems described above. The present invention is directed to satisfying one or more of these needs and to solving other problems.

SUMMARY OF THE INVENTION

According to one aspect of the present invention, a laser diode package includes a laser diode, a cooler, and a metallization layer. The laser diode is used for converting electrical energy to optical energy. The cooler receives and routes a coolant from a cooling source via internal channels. The cooler includes a plurality of ceramic sheets and an exposed sheet. The ceramic sheets are fused together and the exposed sheet is attached to a top ceramic sheet of the plurality of ceramic sheets. The ceramic sheets are made of a material selected from the group consisting of low temperature cofired ceramics and high temperature cofired ceramics. The metallization layer has at least a portion on the exposed sheet. The portion is electrically coupled to the laser diode for conducting the electrical energy to the laser diode.

According to another aspect of the invention, a method of manufacturing a laser diode package includes providing a cooler comprised of the plurality of bonded ceramic sheets and a highly thermally-conductive sheet. The thermally-conductive sheet is bonded to a top ceramic sheet of the plurality of ceramic sheets. The method further includes applying a metallization layer to the thermally-conductive sheet to which the laser diode is attached.

In another embodiment, a laser diode package includes a laser diode, a cooler, and a metallization layer. The laser diode is for converting electrical energy to optical energy. The cooler receives a coolant from a cooling source. The cooler includes a plurality of electrically non-conductive sheets and an exposed sheet having a higher thermal conductivity than the plurality of sheets. The plurality of sheets are fused together and the exposed sheet is attached to a top sheet of the plurality of sheets. The cooler includes internal channels for routing the coolant against a laser-diode mounting region on the exposed sheet. The metallization layer is located on the laser-diode mounting region of the exposed sheet. The laser-diode mounting region is electrically coupled to the laser diode for conducting the electrical energy to the laser diode.

According to yet another aspect of the invention, a laser diode array includes a plurality of laser diode packages, as described above.

The above summary of the present invention is not intended to represent each embodiment or every aspect of the present invention. The detailed description and Figures will describe many of the embodiments and aspects of the present invention.

BRIEF DESCRIPTION OF THE DRAWINGS

The foregoing and other advantages of the invention will become apparent upon reading the following detailed description and upon reference to the drawings.

While the invention is susceptible to various modifications and alternative forms, specific embodiments have been shown by way of example in the drawings and will be described in detail herein. It should be understood, however, that the invention is not intended to be limited to the particular forms disclosed. Rather, the invention is to cover all modifications, equivalents, and alternatives falling within the spirit and scope of the invention as defined by the appended claims.

DESCRIPTION OF ILLUSTRATIVE EMBODIMENTS

Figure 1:
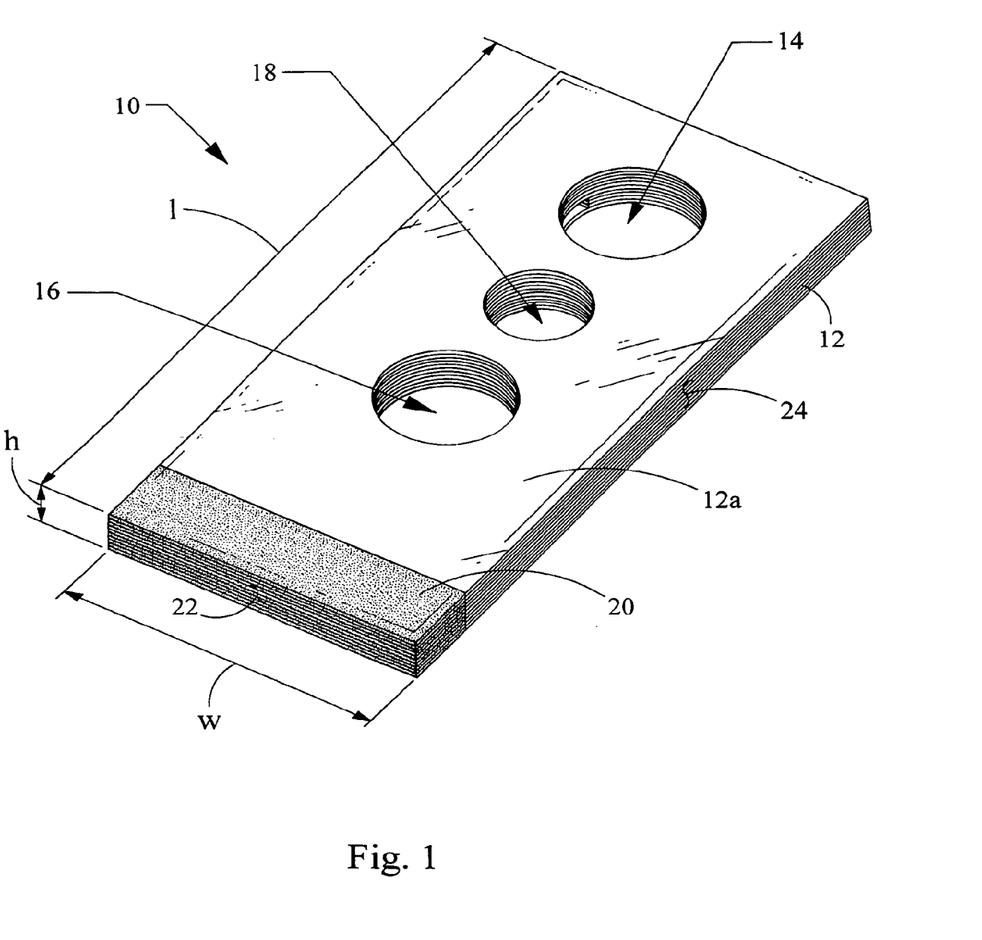
FIG. 1 illustrates a perspective view of a microchannel cooler for a laser diode, according to an embodiment of the present invention.

Referring to FIG. 1, a microchannel cooler 10 includes a plurality of sheets 12, each sheet 12 having an inlet hole 14, an outlet hole 16, and an alignment hole 18. The inlet hole 14 and the outlet hole 16 have generally the same diameter and shape, and are used, respectively, to receive a coolant fluid from and return the coolant fluid to a cooling source. The alignment hole 18 is centrally located between and has a smaller diameter than the inlet hole 14 and the outlet hole 16. The alignment hole 18 is used to align the microchannel cooler 10 when stacked with other microchannel coolers 10, as discussed below with respect to FIG. 4. According to one embodiment, the microchannel cooler 10 has a height (h) of 0.072 inches (1.829 millimeters), a width (w) of 0.460 inches (11.684 millimeters), and a length (l) of 1.038 inches (26.365 millimeters).

As explained in more detail below, the microchannel cooler 10 functions as a coolant manifold that is attached to a high-thermal conductivity material (e.g., diamond) that, in turn, is in direct contact with a laser diode bar to be cooled with the coolant fluid. Because the sheets of the microchannel cooler 10 are electrically non-conductive, the microchannel cooler 10 provides thermal communication and electrical isolation between the laser diode bar and the coolant fluid. While the examples described below specifically refer to a particular type of microchannel cooler, it is understood that alternative embodiments of the microchannel cooler 10 include laminates of non-electrical conductors, semi-insulators, and high-resistivity materials.

Figure 2:
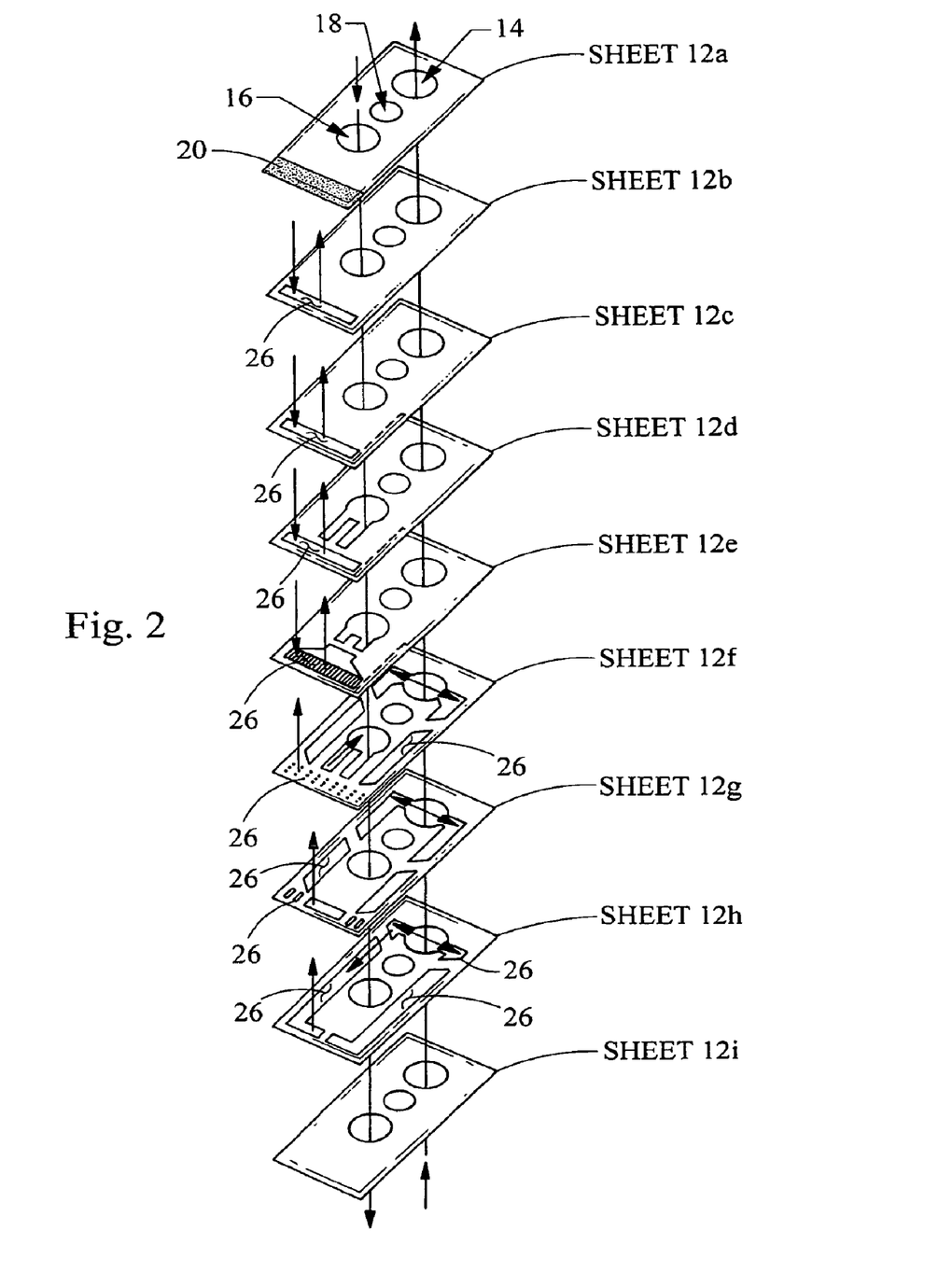
FIG. 2 illustrates an exploded view of the microchannel cooler illustrated in FIG. 1.

Referring to FIG. 2, the plurality of sheets 12 includes nine sheets 12a-12i. The first (or top or exposed) sheet 12a preferably has a high thermal conductivity (e.g., diamond sheet) and the remaining eight lower sheets 12b-12i are low-temperature cofired ceramic ("LTCC") sheets. When made of LTCC, the sheets 12 are bonded together in multiple layers by a thermal process that causes the glass molecules within the ceramic of each layer to bond together. After the sheets 12b-12i are bonded together, the top sheet 12a and the bottom surface of the top ceramic sheet 12b, which are metallized, are bonded together. This metallization is used to ensure a seal of the fluid openings around the inlet 14, the outlet 16, and an aperture 26 (FIG. 2) on the top ceramic sheet 12b. Each of the sheets 12b-12i is processed to produce distinct internal channels (such as by punching or laser etching) so that coolant channels are formed between the respective inlet hole 14 and outlet hole 16 to allow the coolant fluid to pass through the microchannel cooler 10.

In one example, the eight lower sheets 12b-12i are manufactured using a "DuPont 951AX" LTCC material with a thickness of about ten mils (0.01 inches). Alternatively, the eight lower sheets 12b-12i can be made using a high-temperature cofired ceramic material ("HTCC"). Alternatively yet, any of the plurality of sheets 12 can be made from a material selected from LTCC, HTCC, diamond, silicon carbide (SiC), aluminum nitride (AlN), cubic boron nitride (cBN), pyrex, silicon, sapphire, PEEK™ (Polyetheretherketone), beryllium oxide (BeO), glass, and other similar materials. The sheet material is selected based on its low electrical conductivity characteristic, which is needed to prevent the mixing of the coolant and the electrical current.

The top sheet 12a includes a laser diode area 20, which is located on a top surface of the top sheet 12a and is generally a narrow strip. The laser diode area 20 is near a front side 22 (shown in FIG. 1) of the microchannel cooler 10. In one example, the laser diode area 20 is approximately 0.120 inches (3.048 millimeters). A metallic layer is applied to the laser diode area 20 to create an electrically conductive area for conducting electrical current to a laser diode bar (which is not shown) that is mounted on the laser diode area 20. The metallic layer is a solid, solderable metal (e.g., gold), for attaching the laser diode bar. Alternatively, the metallic layer can be made using any electrically conductive material and/or their respective alloys, including gold, nickel, titanium, platinum, etc. The top surface of the top sheet 12a is preferably lapped and polished prior to applying the metallic layer. The front corner between the laser diode area 20 and the front side 22 of the microchannel cooler 10 is typically made "square" with less than twenty-five micrometers, and, preferably, less than five micrometers of rounding.

The metallic layer is also applied along one or more of a front side 22 and a pair of lateral sides 24 (shown in FIG. 1) of the microchannel cooler 10, and along a bottom surface of the bottom sheet 12i. The metallic layer can be applied to the entire surface area of a respective side or it can be applied only to a portion of the respective side. For example, the metallic layer can be applied to only a front portion of a lateral side 24. The metallic layer is used to create an electrical path for conducting electricity from the bottom surface of the bottom sheet 12i to the laser diode bar that is mounted in the laser diode area 20 of the top sheet 12a.

Optionally, the metallic layer that is applied to the sides and/or the bottom surface of the microchannel cooler 10 can be different from the metallic layer that is applied to the laser diode area 20. For example, the metallic layer can be a nickel metal that is applied in the form of a mesh. The dimensions of the metallic layer are optionally selected such that a DC current of 100 amperes can flow to the laser diode bar that is mounted in the laser diode area 20 of the top sheet 12a.

A number of the lower sheets 12b-12i include one or more multi-directional apertures 26 in addition to the inlet hole 14, the outlet hole 16, and the alignment hole 18. For example, the sheet 12h adjacent to the bottom sheet 12i includes a plurality of L-shaped apertures 26 near the front and lateral sides of the sheet 12h, and a plurality of lateral apertures 26 connected to the inlet hole 14. In addition to the coolant fluid flowing in a direction parallel to the axis of the inlet hole 14, the multi-directional apertures 26 are used to distribute the flow of the coolant fluid in at least one other direction that is perpendicular to the axis of the inlet hole 14. Specifically, the multi-directional apertures 26 distribute the coolant fluid beneath the laser diode area 20 for a more efficient removal of heat produced by the laser diode bar. The inlet 14 and outlet 16 have dimensions of about 3 mm to about 4 mm. The dimensions of larger ones of the apertures 26 are in range of about 1 to about 2 mm. The smaller perforations and apertures 26 in the sheets 12e and 12f, which are used for creating enhanced flow (e.g., turbulent flow) toward the backside of the diode area 20 of the top sheet 12a, have dimensions that are in the range of a few hundred microns. Arrows are shown to indicate the general direction of flow of the coolant fluid. Although FIG. 2 illustrates one type of internal channel system in the microchannel cooler 10, other types of channels and paths can be used.

Using a high thermally-conductive material, such as diamond or BeO, for the top sheet 12a increases heat removal performance of the microchannel cooler 10. Further, the electrically non-conductive sheets 12a-12i eliminate the need for using a typical complicated deionized water system. For example, the microchannel cooler 10 can use a simple distilled water system or any other conductive coolant, such as Fluoroinert® from the 3M Corporation.

Figure 3A:
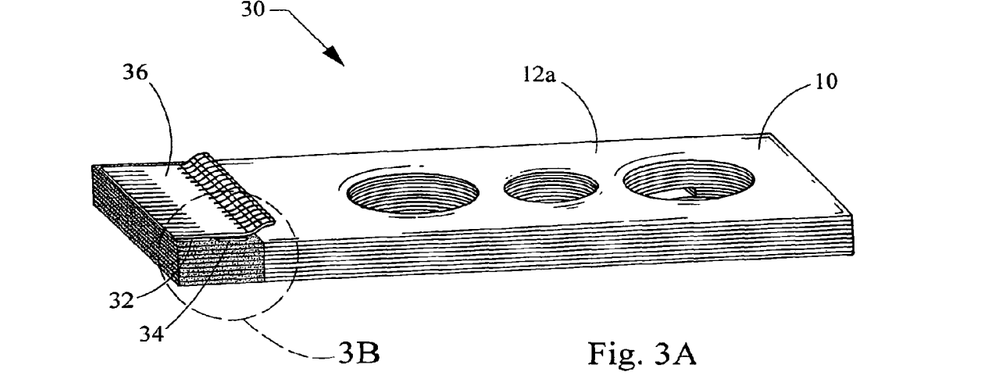
FIG. 3A illustrates a perspective view of a laser diode package, according to another embodiment of the present invention.
Figure 3B:
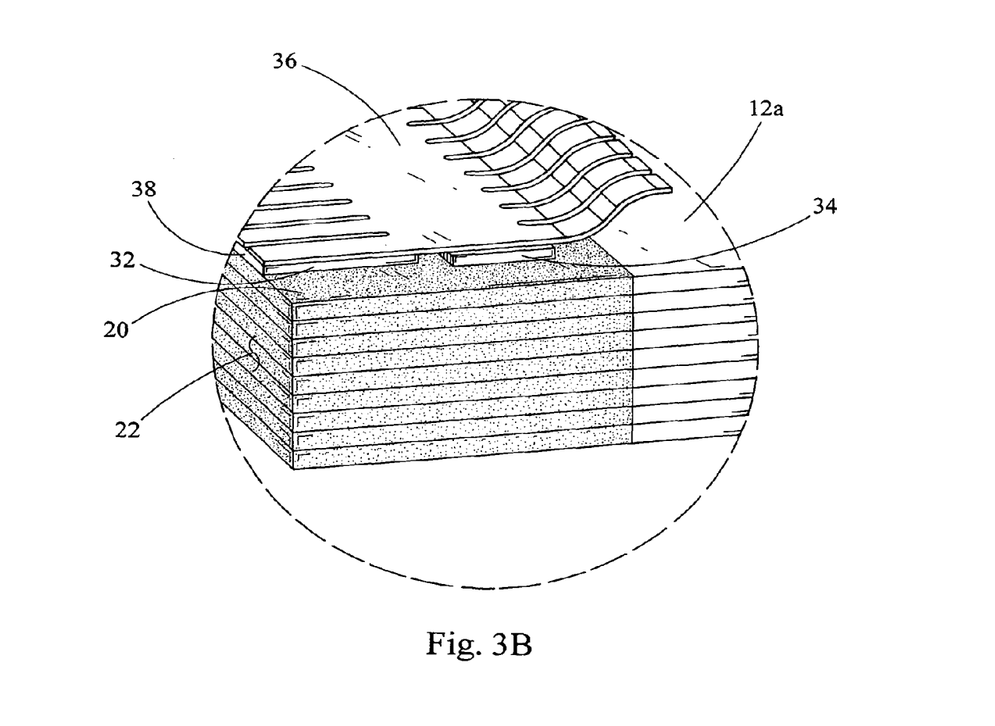
FIG. 3B illustrates an enlarged view of a portion of the laser diode package illustrated in FIG. 3A.

Referring to FIGS. 3A and 3B, a laser diode package 30 includes the microchannel cooler 10, a laser diode bar 32, an insulator substrate 34, and a spring 36. The laser diode package 30 can be used, as explained in more detail in reference to FIG. 4, to stack a plurality of laser diode packages 30 into an array. The laser diode bar 32 is mounted in the laser diode area 20 such that an emitting surface 38 is positioned substantially flush with the front surface 22 of the microchannel cooler 10.

The insulator substrate 34 is made from an electrical insulator, such as BeO. Optionally, the insulator substrate 34 includes a metallic layer on both of its top and bottom surfaces. The metallic layer on the lower surface is present to allow the insulator substrate 34 to be soldered onto the top sheet 12a of the microchannel cooler 10. The metallic layer on the upper surface is present to allow the insulator substrate 34 to be soldered onto the spring 36. The spring 36 is metallic and is mounted to the laser diode bar 32 and the insulator substrate 34. The spring 36 allows electrical contact to the adjacent layer diode package 30, as shown in FIG. 4.

Figure 4:
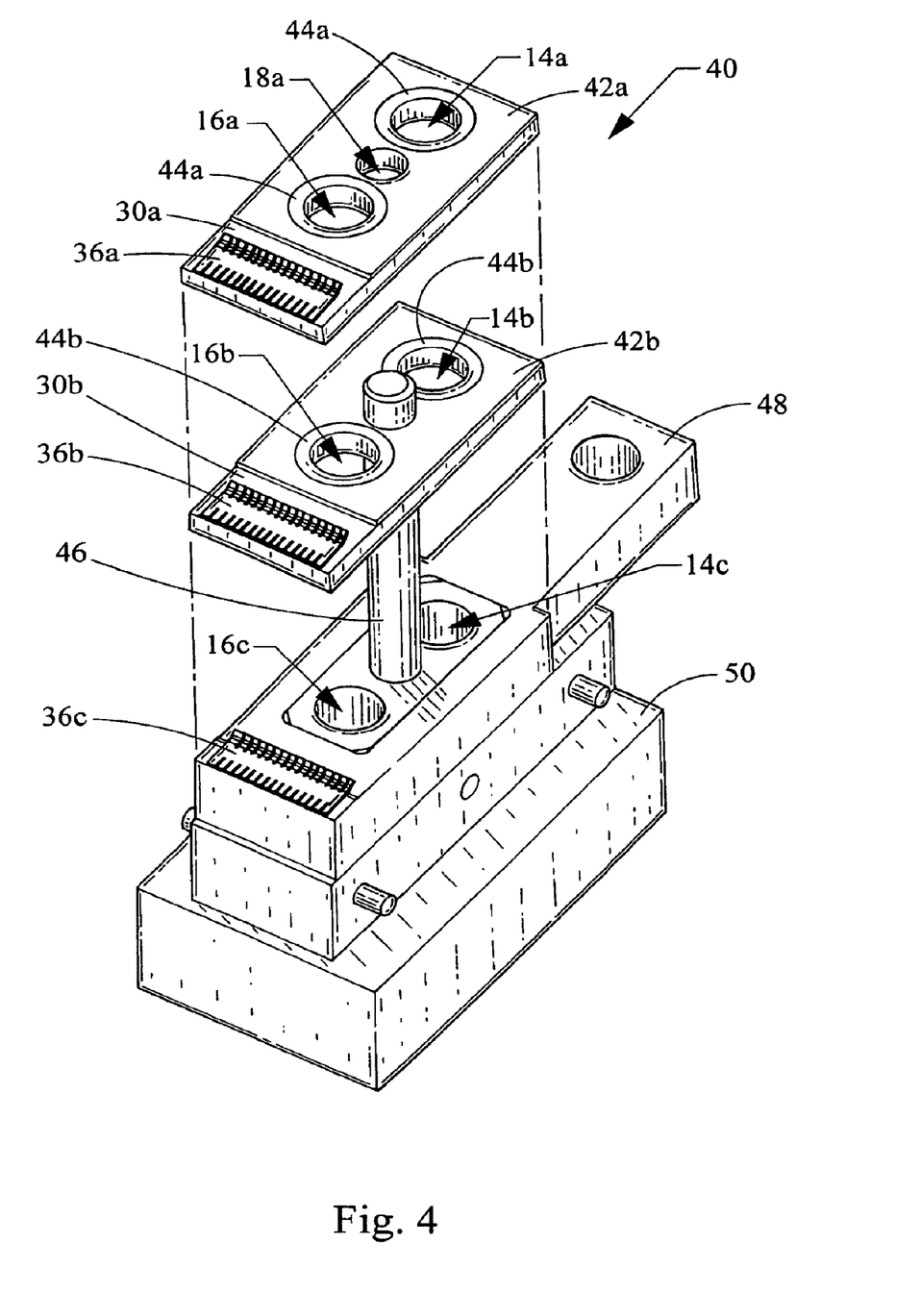
FIG. 4 illustrates an exploded perspective view of a plurality of laser diode packages that create a laser diode array, according to an alternative embodiment of the present invention.

Referring to FIG. 4, a laser diode array 40 includes a top laser diode package 30a and a bottom laser diode package 30b, each of which includes respective spacer plates 42a, 42b and a respective pair of O-rings 44a, 44b. Each spacer plate 42a, 42b is positioned generally overlapping the corresponding inlet hole 14a, 14b, outlet hole 16a, 16b, and alignment hole 18a, 18b (not shown). Each spacer plate 42a, 42b covers a portion of the entire surface area of the top sheet of the respective laser diode package 30a, 30b. Specifically, the spacer plate 42a, 42b covers the portion that is away from the spring 36a, 36b.

The spacer plate 42b on the bottom laser diode package 30b is primarily used for providing a location for the O-rings 44b that are placed over the inlet 14b an the outlet 16b. The spacer plate 42b generally has a thickness that is about the same as the combined thickness of the laser diode bar 32 and the spring 36 in FIG. 3b. In another embodiment, the plate 42b is unnecessary and it is replaced by grooves in the top sheet 12a that receive the O-rings 44b. The same arrangements can be made in the top spacer plate 42a.

The pairs of O-rings 44a, 44b are inserted into respective ones of the inlet hole 14a, 14b and outlet hole 16a, 16b to provide a leak-free passage for the coolant fluid. For example, the pair of O-rings 44b ensure that the coolant fluid will not leak in the space located between the top surface of the bottom spacer plate 42b and the bottom surface of the top laser diode package 30a.

The laser diode array 40 further includes a guide pin 46, a bottom contact 48, and a bottom end cap 50. The guide pin 46 is secured to the bottom contact 48 and is inserted through corresponding alignment holes 18a, 18b of the laser diode packages 30a, 30b. The bottom contact 48 is located between the bottom laser diode package 30b and the bottom end cap 50, from which the coolant fluid flows upwards via the inlet hole 14. The bottom contact 48 includes a respective spring 36c, a respective inlet hole 14c, and a respective outlet hole 16c. The bottom contact 48 is electrically non-conductive, but includes an electrically conductive coating for conducting current to the spring 36c.

The coolant fluid is passed to each of the laser diode packages 30a, 30b via the respective inlet hole 14a, 14b and is returned to via the respective outlet hole 16a, 16b. An upper end cap (not shown) is used to provide a cap to the inlet 14 and the outlet 16 on the uppermost laser diode package 30. Thus, the inlets 14 of the laser diode packages 30 form a top manifold and the outlets 16 form a bottom manifold, such that the fluid is evenly distributed in "parallel" fluid paths through the internal channel systems (formed by the apertures 26 shown in FIG. 2) of each of the laser diode packages 30.

Electrical current flows between the bottom contact 48 and a respective laser diode bar of the top laser diode package 30a. Specifically, electrical current flows on a path that is electrically isolated from the coolant fluid path. The ceramic material (e.g., LTCC or HTCC) used in the sheets of the laser diode packages 30a, 30b acts as an electrical insulator to prevent electrical current from flowing to the coolant fluid. The electrical path created by the combination of the metallic layer (or layers) of each laser diode package 30a, 30b and the springs 36a, 36b, 36c conducts electrical current to each laser diode bar 32 of the laser diode packages 30. For example, the current path follows sequentially the following path: the bottom contact 48, metallic layer associated with the bottom contact 48, the spring 36c associated with the bottom contact 48, the bottom surface of the bottom laser diode package 30b, the metallic layer(s) associated with the bottom laser diode package 30b, the laser diode bar associated with bottom laser diode package 30b, the spring 36b associated with the bottom laser diode package 30b, the bottom surface of the top laser diode package 30a, the metallic layer(s) associated with the top laser diode package 30a, the laser diode bar associated with top laser diode package 30a, and the spring 36a associated with the top laser diode package 30a. The current would then continue to any other laser diode packages 30, eventually leading to a top contact, similar to the bottom contact 48.

Accordingly, because the electrical path is electrically isolated from the coolant fluid path the laser diode packages 30 can use, for example, non-deionized water as a coolant fluid. Thus, the laser diode packages 30 eliminate the need to use deionized water and provide a high cooling capacity by using an electrically non-conductive material (e.g., LTCC and diamond) to route the coolant fluid. In contrast to standard copper (coefficient of thermal expansion (CTE) about $16 \times 10^{-6}$/per °C.) microchannel coolers, the laser diode packages 30 of the present invention also reduce stress on the respective laser diode bars 32 in operation. This is due to the fact that the ceramic sheets 12b-12i of LTCC (CTE about $6 \times 10^{-6}$/per °C.) and a top sheet 12a comprised of diamond (CTE about $1.5 \times 10^{-6}$/per °C.) or BeO (CTE about $8 \times 10^{-6}$/per °C.) have coefficients of thermal expansion that are closer to the gallium arsenide of the laser diode bar (CTE about $6 \times 10^{-6}$/per °C.) than microchannel coolers comprised of copper.

While the present invention has been described with LTCC and HTCC, the microchannel coolers can be comprised of glass materials, such as low-temperature glasses. As used herein, "ceramic" should be understood to mean the inclusion of these glasses. It is also possible to uses BeO or diamond for all of the sheets 12a-12i with metallized surfaces (e.g., gold) allowing those sheets to bond together, such as through diffusion bonding.

While the present invention has been described with reference to one or more particular embodiments, those skilled in the art will recognize that many changes may be made thereto without departing from the spirit and scope of the present invention. For example, the microchannel cooler 10 can use a "serial" cooling path instead of the "parallel" flow path, e.g., the laser diode array 40 uses a single path in which the coolant sequentially flows through each laser diode package 30. Each of these embodiments and obvious variations thereof is contemplated as falling within the spirit and scope of the claimed invention, which is set forth in the following claims.

What is claimed is:

1. A laser diode package comprising:
    a laser diode for converting electrical energy to optical energy; and
    a cooler having a plurality of ceramic sheets including a top sheet, the top sheet having a mounting region for receiving the laser diode, the ceramic sheets having a combination of larger-sized apertures and smaller-sized perforations that form a coolant path through which a coolant flows towards the mounting region, the coolant path including a turbulent flow region that is achieved by individual coolant streams created by the smaller-sized perforations and impinging directly on the mounting region to cool the laser diode.

2. The laser diode package of claim 1, wherein the larger-sized apertures are in the range of about 1 millimeter to about 2 millimeters.

3. The laser diode package of claim 1, wherein the smaller-sized perforations are in the range of a few hundred microns.

4. The laser diode package of claim 1, wherein the smaller-sized perforations are in the range of about 10 times smaller than the larger-sized apertures.

5. The laser diode package of claim 1, wherein the ceramic sheets further include a plurality of smaller-sized apertures located adjacent to the smaller-sized perforations.

6. The laser diode package of claim 5, wherein the smaller-sized apertures are in the range of a few hundred microns.

7. The laser diode package of claim 5, wherein the smaller-sized perforations are formed in a first sheet of the ceramic sheets and the smaller-sized apertures are formed in a second sheet of the ceramic sheets, the first sheet being directly adjacent to the second sheet, the individual coolant streams being created by the coolant first passing through the first sheet.

8. The laser diode package of claim 1, wherein, after impinging directly on the mounting region, the coolant is returned back towards the smaller-sized perforations and is routed to a coolant outlet via a plurality of multi-directional apertures.

9. The laser diode package of claim 1, wherein the sheets have a coolant inlet hole and a plurality of multi-directional apertures, the multi-directional apertures forming a three-dimensional coolant path for routing the coolant from the coolant inlet hole towards the turbulent flow region.

10. A method of cooling a laser diode package, the laser diode package including a laser diode and a cooler, the cooler being formed from a plurality of fused ceramic sheets that includes a first sheet having a plurality of apertures and a second sheet having a plurality of perforations, the laser diode being mounted to a mounting region of a top sheet of the ceramic sheets, the method comprising:
    routing a coolant through the apertures and the perforations, the perforations creating individual coolant streams that cause a turbulent flow region between the second sheet and the mounting region;
    removing excess heat from the laser diode by impinging the individual coolant streams directly on the mounting region.

11. The method of claim 10, wherein the first sheet is immediately adjacent to the second sheet.

12. The method of claim 10, wherein at least one other ceramic sheet is located between the first sheet and the top sheet.

13. The method of claim 10, further comprising forming a three-dimensional path for routing the coolant between a coolant inlet hole and the turbulent flow region.

14. The method of claim 10, wherein the three-dimensional path is achieved by routing the coolant through a plurality of multi-directional apertures of the sheets.

15. The method of claim 10, further comprising returning the coolant directly towards the perforations after impinging on the mounting region.

16. The method of claim 10, wherein the apertures of the first sheet and the perforations of the second sheet are in the range of a few hundred microns.

17. A laser diode package comprising:
    a laser diode for converting electrical energy to optical energy and mounted on a mounting region of a cooler; and
    a plurality of ceramic sheets forming the cooler and having apertures to create a three-dimensional fluid path, the three-dimensional fluid path including a plurality of independent cooling streams created by perforations on at least one of the ceramic sheets, the independent cooling streams impinging directly on the mounting region to create a turbulent flow for cooling the laser diode.

18. The laser diode package of claim 17, wherein the three-dimensional fluid path returns the coolant directly towards the perforations and routes the coolant through apertures that are located on the same at least one of the ceramic sheets on which the perforations are located.

19. The laser diode package of claim 18, wherein the three-dimensional fluid path continues to route the coolant towards an outlet hole after passing through the apertures that are located on the same at least one of the ceramic sheets on which the perforations are located.

20. The laser diode package of claim 17, wherein the perforations are in the range of a few hundred microns and the apertures are in the range of about 1 millimeter to about 2 millimeters.

* * * * *